United States Patent [19]

Gibson

[11] Patent Number: 5,253,199
[45] Date of Patent: Oct. 12, 1993

[54] JJ-MOS READ ACCESS CIRCUIT FOR MOS MEMORY

[75] Inventor: David A. Gibson, Austin, Tex.

[73] Assignee: Microelectronics and Computer Technology Corporation, Austin, Tex.

[21] Appl. No.: 717,302

[22] Filed: Jun. 17, 1991

[51] Int. Cl.[5] .............................................. G11C 11/44
[52] U.S. Cl. ..................................... 365/162; 307/277; 307/306
[58] Field of Search ................. 365/162, 160; 307/306, 307/277; 257/31, 32, 33, 34, 35, 36, 37, 38, 39

[56] References Cited

U.S. PATENT DOCUMENTS

| | | | |
|---|---|---|---|
| 4,130,893 | 12/1978 | Henkels | 365/162 |
| 4,509,146 | 4/1985 | Wang et al. | 365/162 |
| 4,785,426 | 11/1988 | Harada et al. | 365/162 |
| 4,979,205 | 11/1990 | Kotani | 365/162 |

FOREIGN PATENT DOCUMENTS

| | | | |
|---|---|---|---|
| 59-139198 | 8/1984 | Japan | 365/162 |
| 63-87697 | 4/1988 | Japan | 365/162 |

OTHER PUBLICATIONS

Yuh, A buffered Nondestructive-Readout Josephseon Memory Cell with Three Gates, IEEE Trans. Magnetics, vol. 27, No. 2, pp. 2876-2878, Mar. 1991.

S. Nagasawa, et al., 570-ps 13mW Josephson 1-K bit NDRO Ram, IEEE Journal of Solid-State Circuits, vol. 24, No. 5, pp. 401-406, Oct. 1989.

S. T. Flannagan, et al., 8ns CMOS 64K×4 and 256K×1 SRAMs, IEEE Journal of Solid-State Circuits, vol. 25, No. 5, Oct. 1990, pp. 1049-1056.

T. I. Chappell, et al., A 3.5-ns/77K and 6.2-ns/300K 64K CMOS RAM with ECL Interfaces, IEEE Journal of Solid-State Circuits, vol. 24, No. 4, pp. 859-868, Aug. 1989.

I. Kurosawa, et al., A 1-Kbit Josephson Random Access Memory Using Variable Threshold Cells, IEEE Journal of Solid-State Circuits, vol. 24, No. 4, pp. 395-400, Aug. 1989.

Primary Examiner—Robert J. Pascal
Assistant Examiner—Tan Dinh
Attorney, Agent, or Firm—Fulbright & Jaworski

[57] ABSTRACT

Apparatus for selecting memory cells in a MOS memory array and reading data contained therein. Superconducting Josephson junction devices switch between a superconducting and voltage gap mode for rapid selection of an addressed memory cell row and column, and then read out of the selected memory cell data contained therein.

24 Claims, 8 Drawing Sheets

JJ-MOS READ ACCESS CIRCUIT FOR MOS MEMORY

BACKGROUND OF THE INVENTION

1. Field of the Invention

The present invention relates to hybrid circuits and devices fabricated from superconductor materials combined with semiconductor devices that can be operated at low temperatures. More particularly, the present invention relates to improving read access times for random access MOS memories by adding Josephson Junction superconductors to make a hybrid circuit that improves the read access speed and reduces the power consumption.

2. Description of the Related Art

The discovery of superconductors whose critical operating temperatures are above liquid nitrogen temperature prompted increased interest in hybrid superconducting-semiconducting electronic circuit applications. The possibilities for using superconducting devices for interconnecting conventional semiconductor circuits and devices have been studied. See, for example, "Superconductor-Semiconductor Hybrid Devices, Circuits and Systems," Kroger, et al., proceedings of the IEEE, Vol. 77, No. 8, August 1989; T. van Duzer, "Superconductor-Semiconductor Hybrid Devices, Circuits and Systems," Cryogenics, Vol. 28, pp. 527-31 (1988); H. Kroger, "Josephson Devices Coupled by Semiconductor Links," IEEE Trans. Electron Devices, Vol. ED-27, pp. 2016-126 (1980).

Superconductors are devices having no resistance to current flow. Superconducting Josephson Junctions have the unique property of no voltage drop, i.e., no resistance to current flow below a certain critical threshold current, $I_c$. FIG. 1 illustrates a plan view of a schematic representation of a Josephson Junction. Referring now to FIGS. 1 and 2, similar elements of FIG. 1 also in FIG. 2 will be represented with a suffix "a." In FIGS. 1 and 2, superconducting base electrode 20 is deposited on an integrated circuit substrate 32. Insulator 24 is deposited over base electrode 20. A hole 26 is formed into insulator 24 of about 2 micrometers in diameter and through various surface treatments, well known in the art, a very thin insulating layer called a "thin barrier layer" covers the bottom of the hole 26. The superconducting top electrode 22 is deposited over insulator 24 and into hole 26. Electrodes 20 and 22 may be any type of superconductor, such as, for example, niobium ("Nb") or niobium nitride ("NbN"). Electrodes 20 and 22 may be comprised of the same or different superconducting material. The device comprising hole 26, thin insulating barrier 34 and electrodes 20 and 22 is called a Josephson Tunnel Junction ("JJ"). Ohmic contacts 28 and 30 are attached to superconducting electrodes 20 and 22, respectively, for connection to non-superconducting circuits such as integrated circuit MOS transistors.

The JJ described above has the unique property of having no voltage drop between superconducting electrodes 20 and 22 as current flows through the tunnel junction formed at barrier 34. The size of hole 26, however is critical in that the diameter and subsequent area of the hole 26 gives the JJ its ability to maintain zero voltage potential across the tunnel junction until a certain critical current, $I_c$, is reached. Referring now to FIG. 3, a current-voltage characteristic curve (I-V) is illustrated for a typical JJ. The JJ current-voltage characteristic curve illustrated in FIG. 3 has a maximum critical current ($I_c$") 50 up to which no voltage drop appears across the JJ. When current through the JJ exceeds $I_c$ 50, then the zero voltage drop condition ceases to exist and a voltage drop ("$V_{gap}$") 54 results across the junction 34. Thus, a gap voltage 54 appears between electrodes 20 and 22. The gap voltage 54, $V_{gap}$, illustrated in FIG. 3 remains as a potential voltage difference between the electrodes 20 and 22 until the JJ current is reduced to a minimum current 58 wherein the JJ returns to the superconducting state, i.e., no voltage drop across the junction 34. The JJ device is useful for the high speed at which it may be switched from a superconducting to non-superconducting state, typically on the order of 10 picoseconds. The JJ device is bi-directional, i.e., current may flow in either direction, and the resulting current-voltage characteristic curve is a negative mirror image about the x-y axis. Thus, the negative critical current $I_c$ 52 when exceeded causes a negative gap voltage 56 to appear across the JJ junction 34 and the negative $V_{gap}$ 56 will remain until current flow through the JJ is reduced to a minimum current 60, causing the JJ to return to the superconducting condition. Gap voltage 54 for niobium is typically 2.55 millivolts. Typical operating conditions for a JJ would be for about 100 microamperes of current to flow, thus, biasing the JJ to a point just below the critical current, $I_c$. If current greater than $I_c$ flows through the JJ, then the JJ will switch into the voltage gap non-superconducting mode and remain there so long as the biasing current continues through the JJ electrodes 20 and 22. The JJ may be reset from the $V_{gap}$ mode to the superconducting mode by removing current flow from the junction. After resetting the JJ by removing the current flow therefrom, the JJ will remain in the superconducting mode until current flow through it once again exceeds the critical current 50.

Referring now to FIGS. 4a and 4b, a JJ is illustrated with a third element called a control loop 70 above electrode 22b and junction hole 26b. FIG. 4b is a cross-sectional view of the FIG. 4a JJ. Elements of FIGS. 1 and 2 also referred to in FIGS. 4a and 4b will have a suffix "b" after the element number. When a current passes through control loop 70, the JJ critical current $I_J$ value is altered. Current flowing between electrode 20 and 22 through tunnel junction 34 creates a magnetic field that may be altered by a magnetic field created from current flow through control loop 70. The resulting magnetic field generated from the current flow in control loop 70 modulates the magnetic field surrounding the thin barrier 34 and alters the value of the critical current $I_c$ necessary to switch from the superconducting to the $V_{gap}$ mode.

Referring now to FIGS. 5a and 5b, the relationships between critical current, $I_c$, and control loop current, $I_n$, are illustrated graphically. FIG. 5a illustrates the $I_c$ versus $I_n$ curve for a JJ having a very small hole 26. FIG. 5b illustrates the $I_c$ versus $I_n$ curve for a JJ having an elongated hole 26 that is large in the direction of the $I_J$ current. The JJ is normally biased at bias current 82 and is in the superconducting mode. A region 84 exists under curve 80 wherein the JJ remains superconducting, however, if the currents $I_J$ or $I_n$ are changed to bias the JJ at a point above the curve 80, then the JJ will switch to the $V_{gap}$ region 86 and no longer be superconducting. For example, if the loop current, $I_n$, is increased, while bias current 82 remains constant, to the point where the critical current, curve 80, is less than the bias current 82, then the JJ will switch from the superconducting to the $V_{gap}$ mode. For the elongated hole JJ, the $I_c$ versus the $I_n$ curve 80a is not symmetric about $I_n=0$. This non-symmetry may be used to advantage to detect the polarity of the $I_n$ current (direction of current flow).

In summary, control loop current, $I_n$, may be used to alter the value of the critical current required to switch the JJ from its superconducting to its $V_{gap}$ mode or, in the alternative, the control loop current may be used to prevent the JJ from switching from the superconducting mode. Thus, the JJ has either no voltage drop in its superconducting mode or a very small voltage drop when in the $V_{gap}$ mode. Changing from superconducting to $V_{gap}$ mode is current dependent and happens very quickly. The usefulness of the JJ will become more apparent in the detailed description of the present invention.

Referring now to FIG. 6a, a random access memory cell and supporting select logic is illustrated schematically. A memory cell 106 may be either of static or dynamic configuration. A memory cell is generally any one-bit binary circuit with a voltage input and output. For example, the circuit may be as simple as a pair of capacitors as in FIG. 6b, or as complex as a four transistor latch as illustrated in FIG. 6c. Memory cell 106 is representative of many memory cells of like structure comprising an integrated circuit random access memory ("RAM"). A RAM integrated circuit is organized in rows and columns wherein a particular memory cell is designated by the intersection of a selected row and column. Information is read from memory cell 106 by enabling MOS transistors 104 and 138 by means of a voltage signal on word line 102. When the word line 102 activates transistors 104 and 138, the data contents of memory cell 106 connects to bit lines 97 and 127. Next, a read access signal is placed on line 108 which enables MOS transistors 110 and 128, connecting the bit lines 97 and 127, containing the memory cell 106 data, to differential amplifier data receiver 130 inputs 132 and 134, respectively.

During a write operation, data to be written appears on outputs 94 and 124. The complement of the data is connected to input 92 and inverted by inverter 90, likewise, the data is connected to input 122 and becomes the complement on output 124. MOS transistors 96 and 126 turn on when a write access signal on line 98 goes high. The write data information connects to bit lines 97 and 127 through the transistors 96 and 126, forcing the memory cell 106 contents to conform to the write data.

The aforementioned memory read and write operations all require relatively large voltage swings of from 2 to 5 volts to operate the MOS transistor circuits. Electronic integrated circuit elements have capacitance that must be charged or discharged to the appropriate logic voltage levels in order to operate the circuit. In most cases, the higher the capacitance and the higher the voltage swing that is required to operate an electronic circuit, the longer it takes to switch from one voltage level to another voltage level. The inherent voltage charging requirement, often referred to as a circuit's RC time constant, limits the speed in which a random access memory may be written to or read from. Various methods have been introduced to reduce the length of the RC charging time constant by reducing the amount of capacitance inherent in the integrated circuit and/or reducing the amount of voltage change necessary. In addition, reducing the amount of resistance inherent in the switching circuits reduces the RC time constant, however, this may increase power dissipation of the integrated circuit and may not be practical in implementing large scale random access memory.

SUMMARY OF THE INVENTION

In contrast to the prior art, the present invention provides a solution to the restrictions placed on memory speed due to the requirement of charging the circuit capacitance for a given voltage change when accessing the data of a memory cell. The present invention utilizes low temperature superconductive Josephson Junctions in conjunction with conventional low temperature CMOS and MOS circuits to form a hybrid random access memory circuit. During a read operation the system of the present invention does not depend on the large voltage swings necessary for logic change and the inherent circuit delay in charging circuit capacitance of the prior art.

The present invention utilizes a new and novel technique to rapidly read data from a memory cell. Superconducting Josephson tunnel junction ("JJ") devices are utilized to sense the memory cell contents by means of short duration current pulses which may change the JJ devices from the superconducting to the $V_{gap}$ mode very rapidly and with the expenditure of minimal power. The present invention overcomes the prior art RC circuit charging delay when reading the data contents of a memory cell. The system of the present invention uses JJs to read the data contained in memory cells more quickly than would be possible with prior art MOS logic devices. The present invention does so by not having to charge or discharge relatively large voltage levels as is necessary in MOS logic. In addition, the present invention uses JJs in a memory read application for obtaining low power dissipation necessary for use in large scale integrated circuits.

A memory cell may be selected by means of a unique row and column address. The row may be called a "word line" and the column may be called a "bit line". A word line may be common to many memory cells arranged horizontally on an integrated circuit substrate and a bit line may be common to other memory cells arranged vertically. Where a given word line and bit line intersect, a unique memory cell may be selected out of the many thousands of integrated circuit memory cells contained thereon.

The system of the present invention uses JJ devices, after an address is decoded, to select the memory cell row and column during a read operation. The decoded, to select the memory cell row and column during a read operation. The decoded address row is first selected by causing the appropriate JJ word line to switch from the superconducting to the $V_{gap}$ mode. Once the selected word line has a voltage signal present, this voltage may cause current to flow in the control loop of a JJ connected in the bit lines according to the data content of the memory cell. The bit line is selected by the column address selection logic which also utilizes JJ devices. More than one bit line may be selected at one time in order to implement parallel data read out from multiple memory cells.

Current flow in the bit line JJ control loop depends on the data contents of the associated memory cell. When a voltage output signal from the memory cell is present, representative of the data contained therein, an associated MOS transistor is enabled, thus, connecting the associated bit line JJ control loop to the voltage signal on the selected word line. The selected JJ word line signal voltage causes current flow in the above bit line JJ control loop sufficient to reduce the value of its critical current.

The memory cell column is next selected by causing the appropriate column JJ to switch from the superconducting to the $V_{gap}$ mode. Once the selected column JJ switches to the $V_{gap}$ mode, current flows in the associated bit line JJ(s). Current flow through the bit line JJ may or may not cause it to switch from superconducting to $V_{gap}$ mode depending on whether there is current flow in the respective bit line JJ control loop. For example, if there is current flow in the control loop of a bit line JJ then this JJ will switch to the $V_{gap}$ mode and remain in the $V_{gap}$ mode so long as current continues to flow though the JJ.

The bit line current flow is reduced when the bit line JJ is in the $V_{gap}$ mode because this JJ is connected in series with the column select signal and a control loop of a third JJ device used to represent the memory cell data contents during a read operation. When the bit line JJ stays in the superconducting mode, there is no voltage drop across the JJ, thus, more current flows through the read JJ control loop. Current flow through the control loop of the read JJ may reduce the critical current necessary to switch the JJ from a superconducting to a $V_{gap}$ mode.

The preferred embodiment utilizes a two control loop JJ for differentially reading two signals representative of the memory cell contents, one signal representative of the actual memory cell logic level the other signal representative of the complement. Having two signals representative of the memory data contents allows better noise immunity when reading the memory cell. A single ended circuit using only one control loop in the read-JJ may require higher signal levels for rejection of noise, however, it works in similar fashion to the preferred embodiment but with fewer circuit elements.

Next, a memory read signal causes the read-JJ to either switch to the $V_{gap}$ mode or remain in the superconducting mode depending on whether the current in its control loop(s) increase or decrease the read-JJ critical current. Once the memory read signal causes current to flow through the read-JJ, the row and column select JJ signals may be removed. Not needing the memory cell address selection logic signals any further enables the system of the present invention to select the next memory cell location for a subsequent read operation. Meanwhile, the present memory cell data is determined from the read JJ mode. The read-JJ in the $V_{gap}$ mode may be representative of a logic 1 in the memory cell and, conversely, the superconducting mode may be representative of a logic 0.

Utilization of the information obtained by the above read operation may require amplification of the signals read to standard computer logic signal levels. For example, the read-JJ $V_{gap}$ signal amplitude may only be 2.55 millivolts for niobium superconducting material. The small, relative to MOS, voltage signal levels of the present invention greatly reduces the circuit charging time delay compared to a comparable MOS read logic circuit. In addition, the small operating currents of JJ devices in conjunction with either zero voltage drop (no resistance) of $V_{gap}$ voltage drop (2.55 millivolts per JJ device) result in extremely low power dissipation for a RAM integrated circuit using the embodiment of the present invention. This low power factor is extremely important in fabricating large scale integrated circuits containing many thousands of memory cells.

The present invention utilizes the properties of Josephson tunnel junctions for extremely fast memory cell selection, data storage and low power consumption. The embodiment of the present invention may be utilized with existing MOS RAM, CMOS RAM, Bipolar RAM, in computers, electronic data memories, network switching systems, data interconnect systems or in any application requiring high speed, low power electronic data memory.

An object of the present invention is to select a memory data storage cell and read the data contained therein using superconducting Josephson tunnel junction devices.

A further object of the present invention is to use JJ devices to enable a row and column of a RAM integrated circuit wherein a unique data storage memory cell is selected and then read the data contained in the selected memory cell.

Another object of the present invention is to use JJ devices to increase address selection and read access speed of a RAM by reducing the amount of signal voltage change necessary to charge the circuit capacitances.

Still a further object of the present invention is to integrate JJ devices with MOS devices onto an integrated circuit RAM for selecting word and bit lines wherein the mode of at least one bit line JJ is altered to represent the data content of an associated memory cell, and selecting a read JJ wherein the data content of the associated memory cell is represented by the read JJ mode.

The circuits of the present invention have particular application to a wide variety of digital VLSI applications, including fast static random access memories used, for example, in cache and main memories of digital computers. Other and further objects, features and advantages will be apparent from the following detailed description of the preferred embodiment of the invention, given for the purpose of disclosure and taken in conjunction with the accompanying drawings.

BRIEF DESCRIPTION OF THE DRAWINGS

FIG. 4b is a cross-sectional view of the JJ of FIG. 4a.

FIG. 7 is a schematic diagram of a hybrid superconducting-semiconducting circuit, according to the present invention, having faster read access performance than the circuit of FIG. 6a;

DETAILED DESCRIPTION OF THE PREFERRED EMBODIMENT

The present invention is utilized in a metal oxide semiconductor ("MOS") random access memory ("RAM") and uses a new and novel read circuit comprised of superconducting Josephson junction ("JJ") devices. The JJ devices of the present invention are controlled by current which is directed through precharged field effect transistors ("FET") of the RAM row and column address selection logic. Increased read access speed of the RAM is realized because the FETs are not required to switch during read access, thus, no large change in gate to source voltage is required during the critical read cycles. The speed of the present invention's read circuits depend primarily on the speed of the JJ devices in conjunction with the small-signal ON-resistance of the FETs and the inductances and capacitances of the RAM integrated circuit substrate interconnections.

Figure 1:
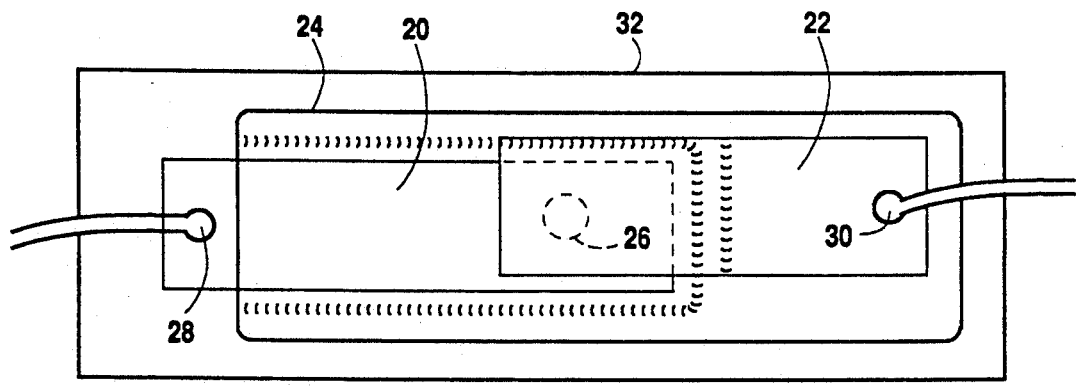
FIG. 1 is a schematic plan view of a Josephson Junction ("JJ") with superconductive, semiconductive, insulative and ohmic conductive materials.
Figure 2:
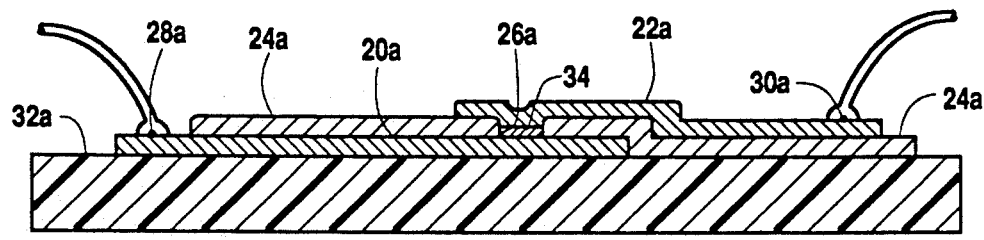
FIG. 2 is a cross-sectional view of the JJ of FIG. 1.
Figure 3:
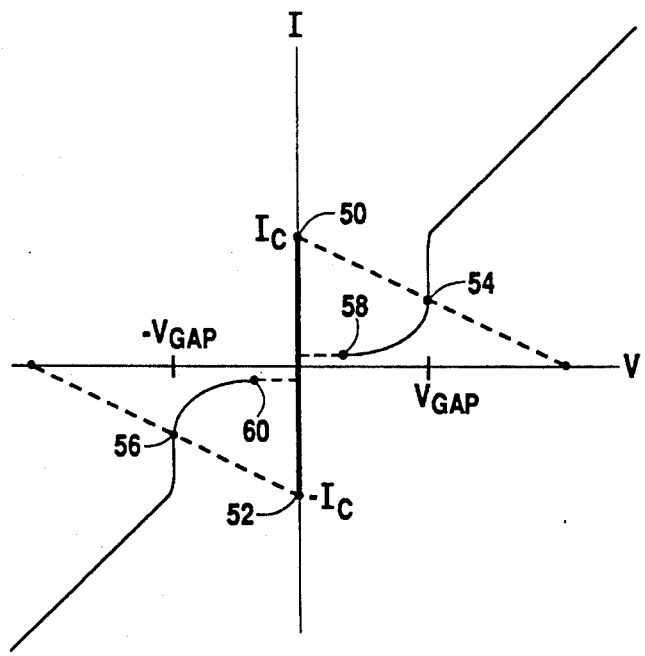
FIG. 3 is a current-voltage characteristics diagram for a typical JJ.
Figure 4A:
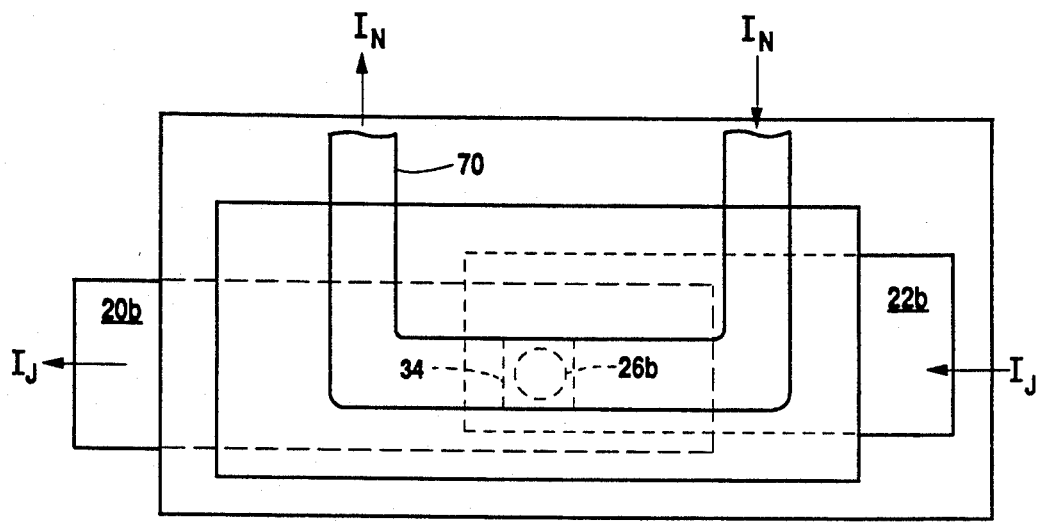
FIG. 4a is a schematic plan view of the JJ of FIG. 1 having a control loop of superconductive materials.
Figure 4B:
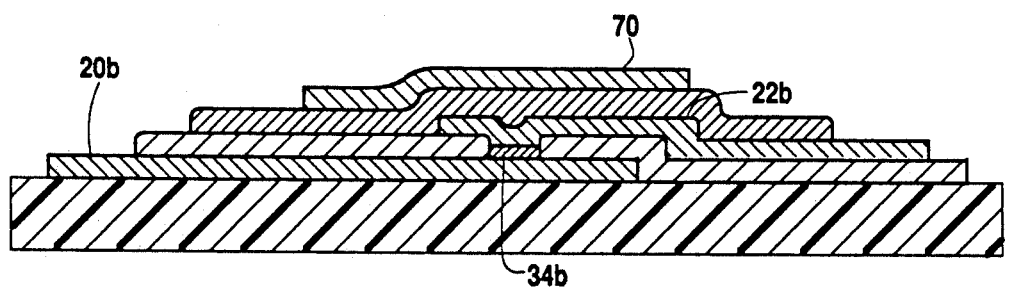
Figure 5A:
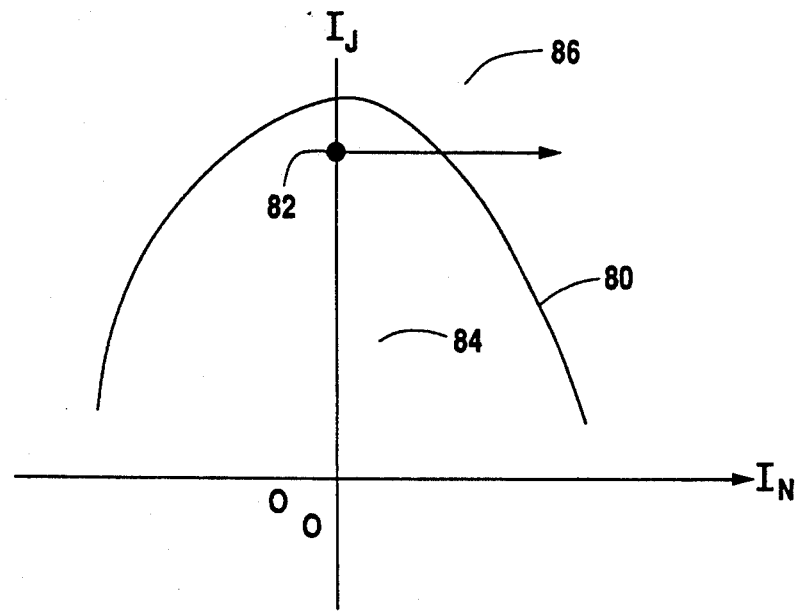
FIG. 5a is a control current-critial current characteristics diagram for a JJ having a small hole.
Figure 5B:
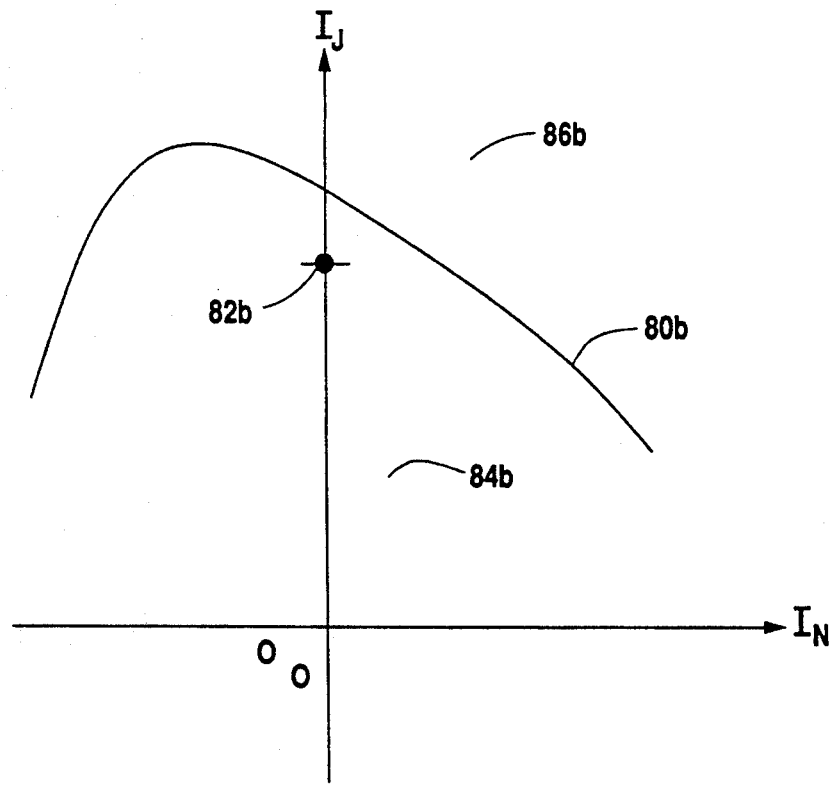
FIG. 5b is a control current-critial current characteristics diagram for a JJ having an elongated hole.
Figure 6A:
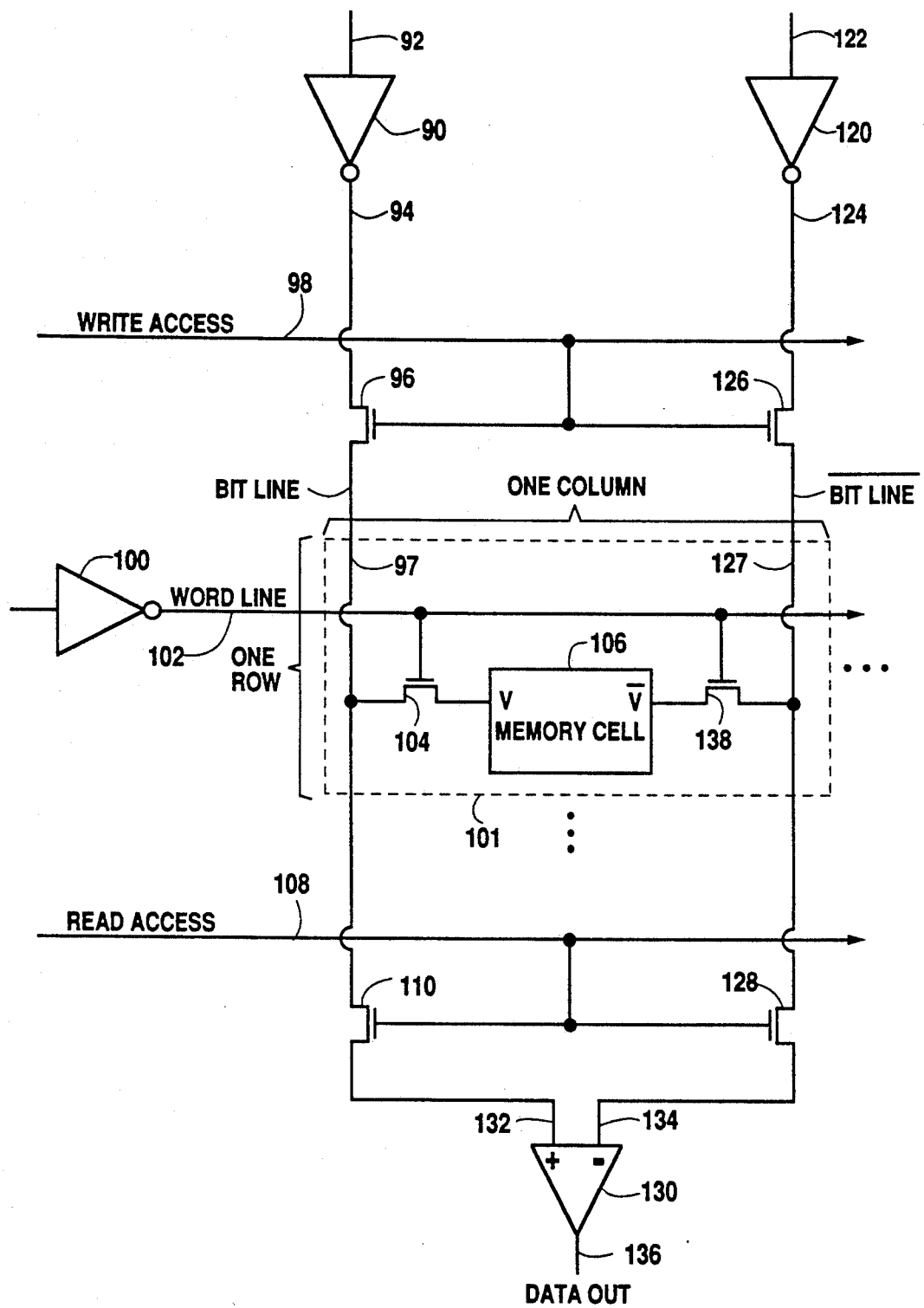
FIG. 6a is a schematic diagram of a portion of a typical MOS memory circuit illustrating one memory cell having differential write and read circuits.
Figure 6B:
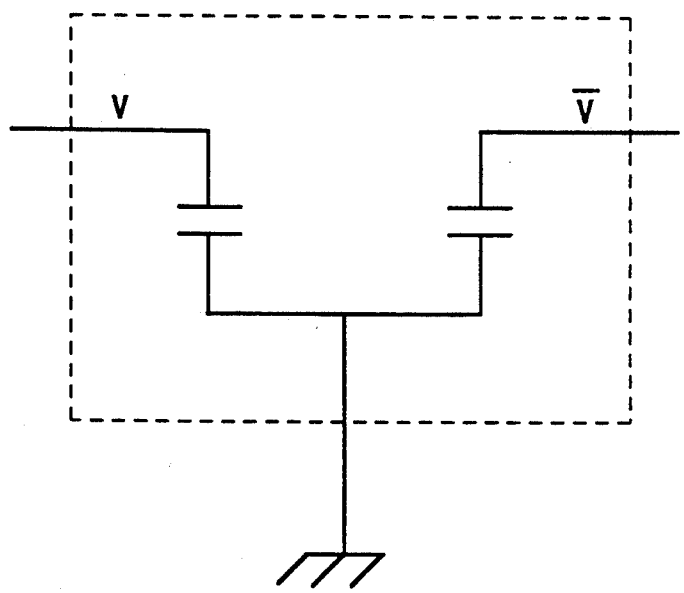
FIGS. 6b and 6c are schematic diagrams of different memory cells.
Figure 6C:
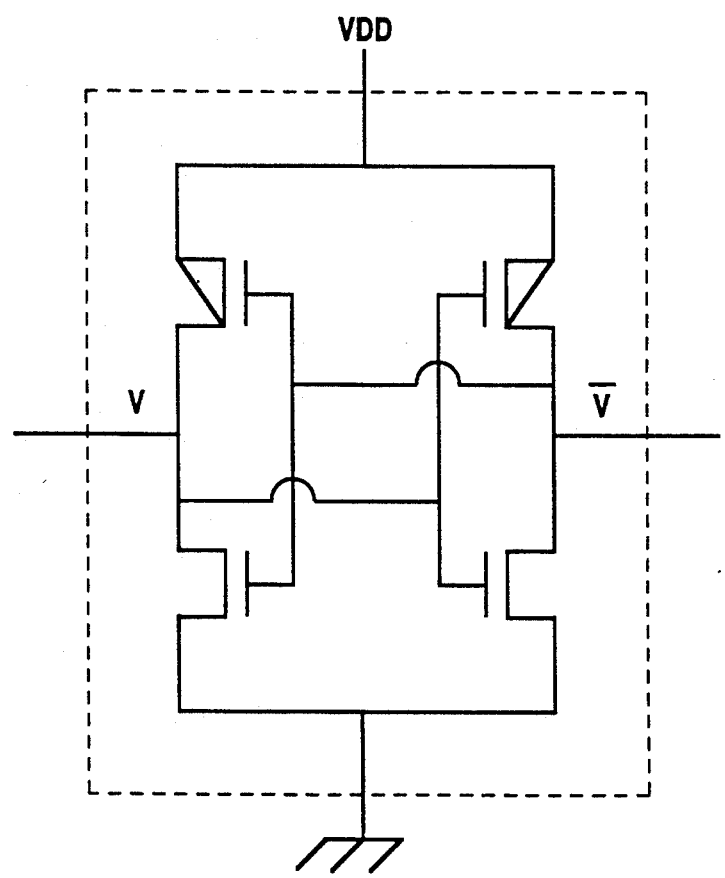
Figure 7:
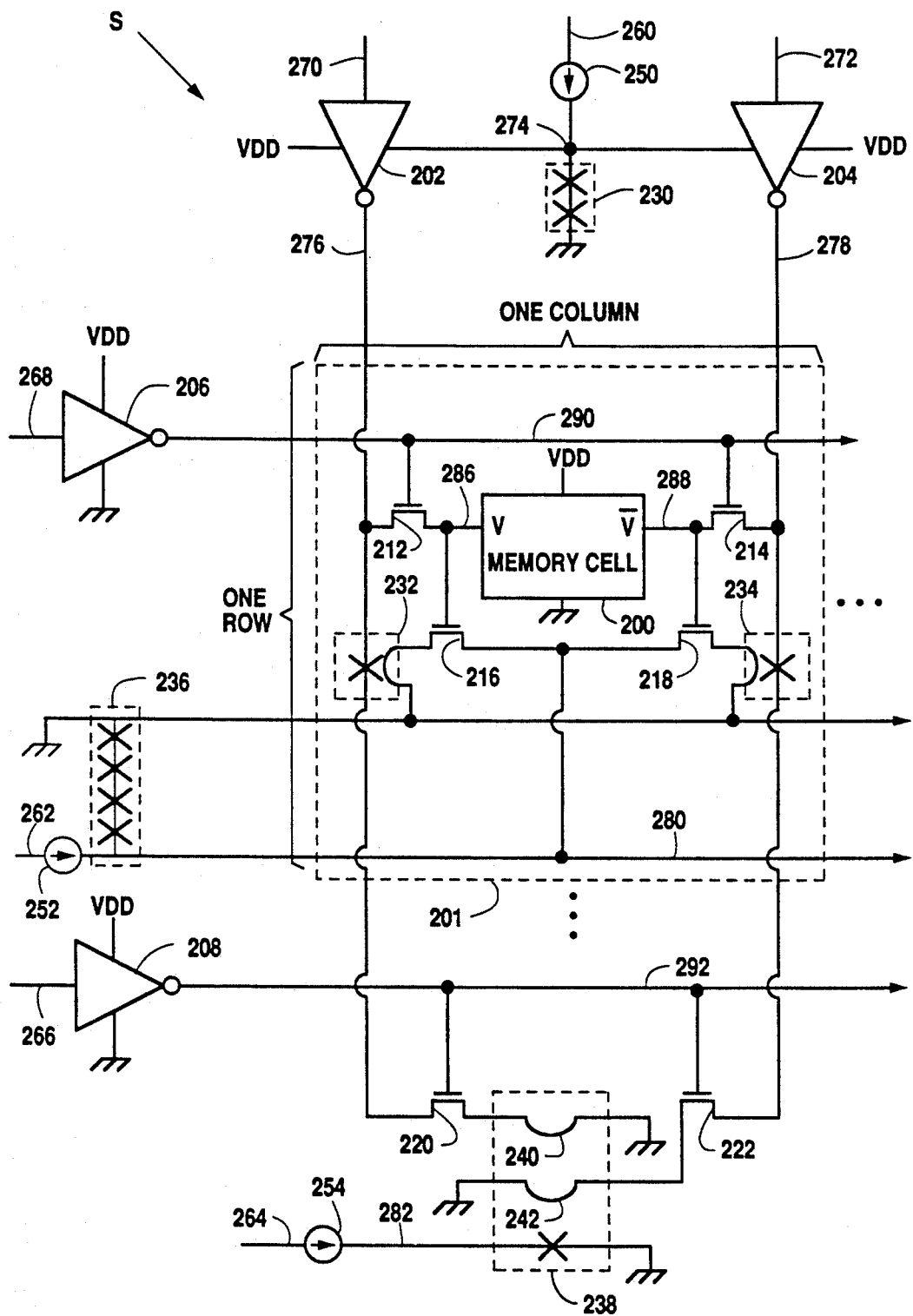

The preferred embodiment of the present invention utilizes a conventional RAM circuit operating at temperatures consistent with the temperature required for the superconducting devices of the invention. FIG. 7 is a simplified schematic diagram of such a device, comprised essentially of standard integrated circuit RAM memory cells, address decoding means, and data write means.

Referring now to the drawings, the details of the preferred embodiment are schematically illustrated in FIG. 7. In the drawings, the letter S designates generally the JJ-MOS read access circuit for MOS memory. For illustrative purposes only one repeat-cell 201 is represented in FIG. 7; an actual RAM utilizing the present invention may be comprised of many thousands of such repeat-cells and supporting logic, each operating substantially as follows.

Referring now to FIG. 7, data may be written into a memory cell 200 by first decoding address bits to determine which row will be active (not shown). While address decoding, the data and its complement are communicated to bit line drivers 202 and 204 which cause the selected memory cell 200 to accept the new data upon a write command. As an example, when writing a logic "1" into memory cell 200, a logic low and high are placed on first and second inputs 270 and 272, respectively. Logic signals on the inputs 270 and 272 of the first and second inverter drivers 202 and 204 are inverted at first and second outputs 276 and 278, respectively. Thus, output 276 is high when input 270 is low and output 278 is low when input 272 is high.

Once the signals on the inputs 276 and 278 are stable, data may be written into memory cell 200. When writing data into memory cell 200, write input 268 is brought low causing write inverter 206 output 290 to go high. A logic high signal on output 290 turns on first and second MOS transistors 212 and 214 connecting outputs 276 and 278 to memory cell first and second outputs 286 and 288. Memory outputs 286 and 288 are forced to conform to the signal logic levels on outputs 276 and 278, respectively, because the ON impedance of transistors 212 and 214 is lower than the impedance of memory cell 200. Output 290 only has a logic high signal when data is being written to the memory cell 200. Once memory cell 200 is stable, a logic high signal on write input 268, causes the write inverter 206 to force a logic low on output 290, turning off transistors 212 and 214, and effectively disconnecting the memory cell outputs 286 and 288 from outputs 276 and 278, respectively. Data is retained in the memory cell 200 indefinitely until another write operation writes new data.

Data is read from a memory cell 200 by first decoding the address bits (not shown) to determine which memory cell row will be active. During a read operation, inputs 270 and 272 have a logic high signal which forces both outputs 276 and 278 low. Output 290 is also low.

To access the data contents of memory cell 200, a logic low signal is placed on read input 266 causing read inverter driver 208 to place a logic high on read output 292. A logic high signal on output 292 turns on MOS transistors 220 and 222, thus, connecting JJ 232 to loop 240 (JJ 238) and JJ 234 to loop 242 (JJ 238), respectively. While the address decoding takes place, MOS transistors 220 and 222 in the RAM read circuit are becoming enabled but do not conduct current because outputs 276 and 278 are grounded through drives 202 and 204 and JJ 230. After sufficient address decoding delay, a current pulse is sent to the selected JJ word line 280. This current pulse is of sufficient magnitude to exceed the critical current of the JJ controlling the word line, thus, the word line JJ 236 is switched into its $V_{gap}$ mode.

The word line JJ 236 may be comprised of four series connected Nb JJs resulting in a $V_{gap}$ voltage of approximately 10 millivolts across the selected word line 280. No other word line JJs are selected so they remain in the superconducting mode (zero voltage). The 10 millivolt signal on the selected word line 280 causes current to flow through the active control loops of bit line JJs 232 and 234 associated with the selected word line 280.

A bit line JJ control loop is active when in series with a MOS transistor turned on by the associated memory cell output being at a logic high. When a memory cell output is at a logic low, then the associated MOS transistor is off and current cannot flow into the bit line JJ control loop in series with the off transistor. The MOS transistors in series with the bit line JJ control loops are controlled by the static memory cell output and are, thus, independent of and do not affect the timing of a read access.

For example, when a data logic "1" is contained in the memory cell 200, output 286 is high and output 288 is low. A logic high on output 286 turns on third MOS transistor 216 and a low signal on output 288 turns off fourth MOS transistor 218. Therefore, current may flow only through the control loop of JJ 232. Transistor 218, being off, prevents the possibility of current flow through the control loop of JJ 234. On unselected rows, JJ 236 is in a superconducting mode, thus, no voltage exists across JJ 236 and no current flows through transistor 216 into the control loop of JJ 232.

During a read operation, according to the embodiment of the present invention, a row is selected with the leading edge of first JJ clock 262 which is a positive voltage and is connected to first current source 252. The purpose of source 252 is to limit current flow through JJ 236 to slightly more than its critical current. When the critical current of JJ 236 is exceeded, JJ 236 switches from the superconducting mode to the $V_{gap}$ mode. There may be, for example, four niobium JJs in series, thus, the $V_{gap}$ voltage may be 10 millivolts across JJ 236 after it switches from the superconducting to the $V_{gap}$ mode. JJ word line output 280 now has a 10 millivolt amplitude signal for as long as JJ 236 is in the $V_{gap}$ mode by maintaining current from source 252. A voltage signal on output 280 causes current flow through conducting transistor 216 and the control loop of JJ 232. Current through the control loop of JJ 236 is maintained during the column select.

The column associated with memory cell 200 is selected when second JJ clock 260 applies a positive going voltage leading edge to second current source 250. The purpose of source 250 is to limit current flow through JJ 230 to slightly more than its critical current. When the critical current of JJ 230 is exceeded, JJ 230 switches from the superconducting mode to the $V_{gap}$ mode. JJ 230 may have, for example, two niobium JJs in series, thus, the $V_{gap}$ voltage may be 5 millivolts across JJ 230 after it switches from the superconducting to the $V_{gap}$ mode. Connection 274 is now at 5 millivolts in amplitude so long as the clock 260 signal has a positive voltage sufficient to maintain current flow through JJ 230. The 5 millivolt signal on connection 274, being in the ground return of drivers 202 and 204, causes the outputs of drivers 202 and 204 to increase positively by 5 millivolts. The ground returns of drivers 202 and 204 are connected to connection 274 and will be at ground reference potential when JJ 230 is in the superconducting mode. When JJ 230 switches from the superconducting to the $V_{gap}$ mode, connection 274 rises 5 millivolts above the ground reference, biasing outputs 276 and 278 positively by 5 millivolts.

The 5 millivolt positively biased output 276 of driver 202 causes current to flow through JJ 232, transistor 220 and control loop 240 of JJ 238. In similar fashion, the output 278 of driver 204 causes current to flow through JJ 234, transistor 222 and control loop 242 of JJ 238. The currents flowing through each of the JJs 232 and 234 are of such magnitude that the critical current will be exceeded if there is current flow in a respective JJ control loop. Thus, from the example above, there is current flow in the control loop of JJ 232 sufficient to cause JJ 232 to switch from the superconducting to the $V_{gap}$ mode when current from output 276 is present.

Once JJ 232 switches to the $V_{gap}$ mode it will stay in this mode until current flow ceases. In accordance with the above example, JJ 234 having no current flow through its control loop, remains in the superconducting mode because the current flow resulting from the 5 millivolt signal on output 278 is below the critical current level required to switch from superconducting to $V_{gap}$ mode. The signals on outputs 276 and 278 remain between 3 and 5 millivolts so long as a positive voltage remains on clock 260 causing source 250 to supply current to JJ 230.

In the example above, however, the current flow associated with JJ 232 is less than the current flow associated with JJ 234 because JJ 232 has switched into the $V_{gap}$ mode, thus, introducing a 2.55 millivolt drop in the loop formed by JJ 232, transistor 220 and control loop 240. JJ 238 has two loops oriented so that only the difference between the magnetic flux densities generated from the current flow in each of the loops 240 and 242 will effect the critical current of JJ 238. Thus, the current flowing in each of the loops 240 and 242 creates a net magnetic field which affects whether JJ 238 switches from the superconducting to the $V_{gap}$ mode when current is introduced into JJ 238 from current source 254.

The present invention utilizes the JJ 238 control loops 240 and 242 to sense the magnitude and polarity of the difference in the currents flowing therein. When the current magnitude is greater in loop 242 than in loop 240, the magnitude of critical current necessary to switch JJ 238 from the superconducting to the $V_{gap}$ mode is less than what may be supplied from current source 254 when third clock 264 is at a positive voltage. On the other hand, when the current magnitude is less in loop 242 than in loop 240, the critical current exceeds the available current from source 254. In this arrangement, so long as transistors 220 and 222 are enabled, the present invention can detect the contents of the memory cell without the necessity of charging circuit capacitances to MOS voltage levels and the inherent time delays thereof.

Once JJ 232 has switched from the superconducting to the $V_{gap}$ mode, clock 264 may be raised to a positive voltage and current from source 254 will cause JJ 238 to switch from superconducting to $V_{gap}$ mode if the current flow in control loop 240 is less than the current in control loop 242. Conversely, if the current in loop 240 is greater than in loop 242, JJ 238 will not switch out of the superconducting mode because the critical current of JJ 238 has not been exceeded.

Figure 9:
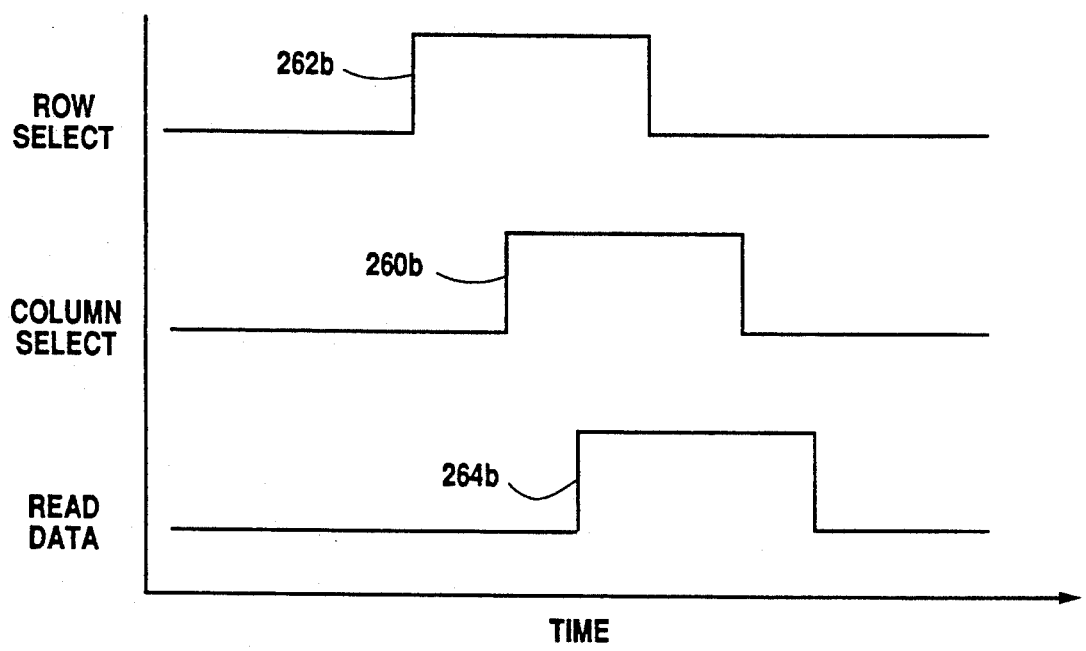
FIG. 9 is a timing chart for JJ clocks, according to the present invention.

Thus, when JJ 238 is in the $V_{gap}$ mode the memory cell 200 contains a logic "1" and when JJ 238 stays in the superconducting mode cell 200 contains a logic "0". This read information may be utilized by a JJ computer system directly, or by a semiconductor computer system through the use of an amplifier, such as is disclosed in U. Ghoshal, "CMOS Inter-Chip Interconnection Circuit Using High-Tech Superconducting Tunnel Junctions and Interconnections," IEEE Electron Device Letters, vol. 10, pp. 373–76, August 1989. A timing chart for JJ clocks 260, 262 and 264 is illustrated in FIG. 9, with each JJ clock voltage waveform having the same reference number as the associated clocks but with the addition of suffix "b".

In summary, a JJ read operation, according to the preferred embodiment of the present invention, selects the memory cell row and column of interest, then causes a differentially connected read control loop JJ 238 to switch into the $V_{gap}$ mode if the memory cell 200 selected contains a logic 1, otherwise JJ 238 remains in the superconducting mode. All JJs 230, 232, 234, 236 and 238 may be reset to the superconducting mode by removing current therefrom. Thus, removing the clock source voltages 260, 262 and 264 resets the system of the present invention for another read operation at the same or the next memory location(s).

Figure 8:
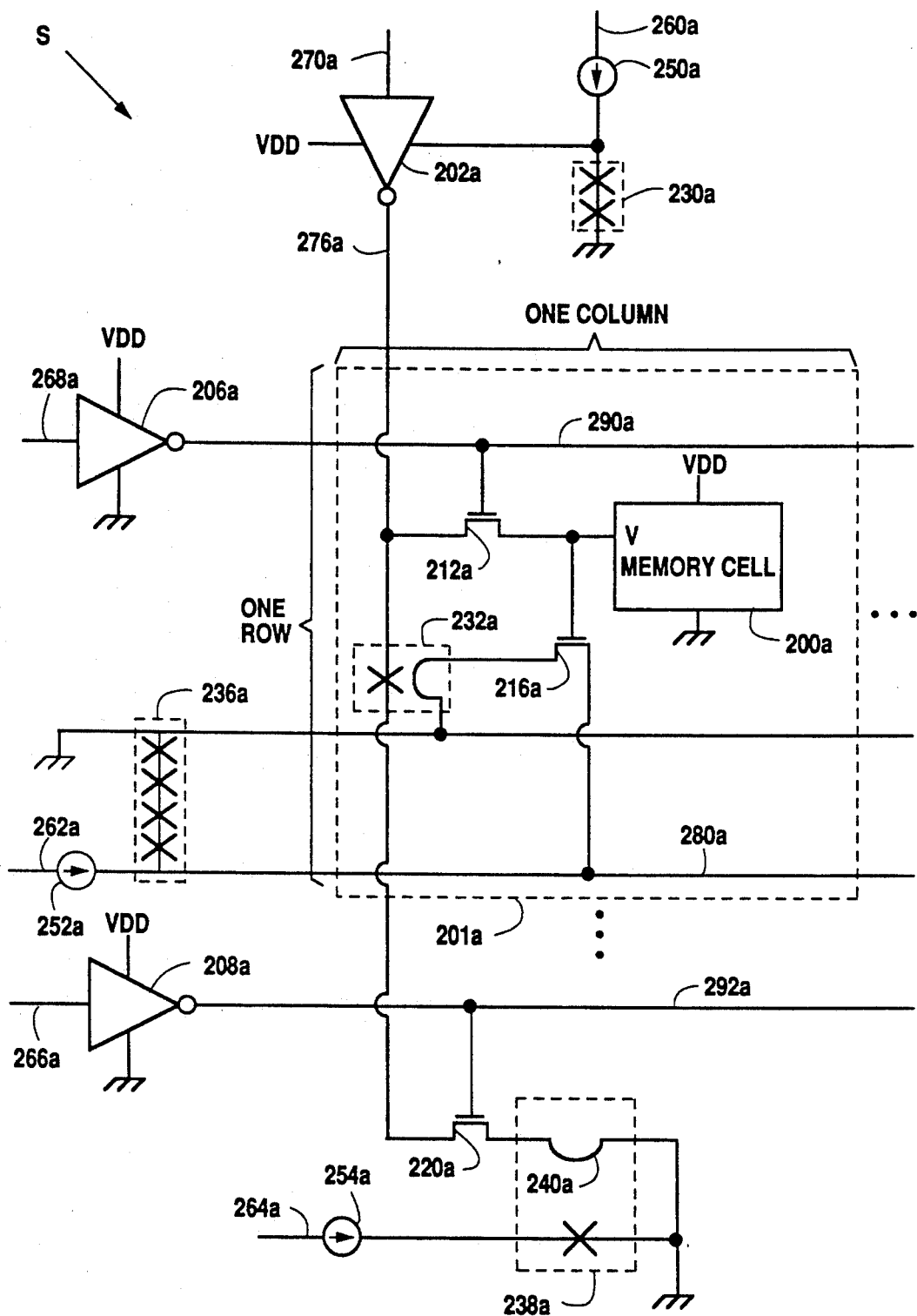
FIG. 8 is a schematic diagram of a hybrid superconducting-semiconducting circuit, according to the present invention, using single ended write and read circuits.

The above embodiment of the present invention uses two bit line JJs per memory cell. Referring now to FIG. 8, a single ended embodiment of the present invention is illustrated and all comments herein are equally applicable to both embodiments. All similar elements of FIG. 7 that are illustrated in FIG. 8 have a suffix "a". Operation of the circuit schematically illustrated in FIG. 8 differs in operation from the circuit of FIG. 7 only in the use of a single loop JJ 238a and single ended operation of the control and sense circuits therein.

A drawback to the single ended read embodiment of the circuit schematically illustrated in FIG. 8 may be in reduced noise threshold discrimination. Reliable operation may be obtained, however, if an adequate difference exists between the current through JJ 232a in the superconducting versus the $V_{gap}$ mode. An important feature of the embodiment illustrated in FIG. 8 is the reduced number of circuit elements necessary to perform a JJ read operation. Fewer elements means more densely packed and thus greater capacity RAM integrated circuits.

Additional embodiments of the above invention may be realized by replacing single junction JJs 232, 232a, 234, 238 or 238a by subcircuits of two or more JJs connected in parallel, known to those skilled in the art as Superconducting Quantum Interference Devices or SQUIDs.

Further embodiments of the above invention may be realized by replacing field effect transistors 216a and/or 220a and/or FET pair 216 and 218, and/or FET pair 220 and 222 with superconducting field effect transistors (SFETs), which are capable of conducting currents of magnitude comparable to JJ 232 when the SFET is enabled and which provide high resistance (greater than 10,000 ohms) when disabled. A further embodiment of the invention may be realized by replacing inverters 202 and 204 with inverters using SFETs to connect output 276 and connection 274 and output 278 to connection 274, respectively. Use of SFETs may further reduce the already low power consumption of the embodiment of the present invention and improve the density of a JJ-RAM array fabricated on an integrated circuit.

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process will be readily apparent to those skilled in the art and which are encompassed within the spirit of the invention and the scope of the appended claims.

What is claimed is:

1. An electrical circuit for selecting memory cells in a memory array and reading data contained in a selected memory cell, said memory cells selected by a memory array row and a memory array column, said electrical circuit using superconducing junction devices that are switched between a superconducting and voltage gap mode, said memory cells not using such superconducting junction devices, said circuit comprising:

a first superconducting junction device for selecting a memory array row;

a second superconducting device for selecting a memory array column;

third and fourth superconducting devices each having a control loop for modifying the amount of critical current required to switch modes;

a fifth superconducting device having first and second control loops, wherein the difference between the currents in said first and second control loops controls the amount of critical current required to switch modes in said fifth junction device;

first clock means connected to said first junction, said first clock means having a current signal that switches said first junction into the voltage gap mode thereby generating a memory array row select signal;

means for providing the row select signal to said third junction device control loop when the memory cell contains a logic one and to said fourth junction device control loop when the memory cell contains a logic zero;

means for providing the output voltage of said third and fourth devices as an input control signal to said first and second control loops of said fifth junction device, respectively;

second clock means connected to said second junction, said second clock means having a current signal that switches said second junction into the voltage gap mode thereby generating a memory array column select signal;

means for providing the column select signal to said third and fourth junction devices, wherein the column select signal switches said third or fourth junction into the voltage gap mode when the respective control loop is connected to the row select signal; and third clock means connected to said fifth junction, said third clock means having a current signal that switches said fifth junction into the voltage gap mode when the current resulting from the column select signal is less in the first control loop than in the second control loop of said fifth junction, causing the data contents of the memory cell to be presented at the fifth junction mode.

2. The circuit of claim 1, wherein the first superconducting junction device comprises at least one Josephson tunnel junction.

3. The circuit of claim 1, wherein the second superconducting junction device comprises at least one Josephson tunnel junction.

4. The circuit of claim 1, wherein the superconducting devices are made of niobium.

5. The circuit of claim 1, wherein the superconducting devices are made of niobium nitride.

6. The circuit of claim 1, wherein the superconducting devices each have first and second terminals adapted for connection in an integrated circuit.

7. The circuit of claim 1, wherein the means for providing a signal comprises field effect transistors.

8. The circuit of claim 1, wherein the means for providing a signal comprises bipolar junction transistors.

9. The circuit of claim 1, wherein the means for providing a signal comprises complementary field effect transistors.

10. The circuit of claim 1, wherein the means for providing a signal comprises superconducting field effect transistors.

11. The circuit of claim 1, further comprising a means for converting the voltage gap signal level from said fifth junction to a voltage signal level compatible with field effect transistor logic.

12. The circuit of claim 1, further comprising means for selecting the next memory cell row and column while reading said fifth junction mode representative of the data contents of the presently selected memory cell.

13. An electrical circuit for selecting memory cells in a memory array and reading data contained in a selected memory cell, said memory cells selected by a memory array row and a memory array column, said electrical circuit using superconducting junction devices that are switched between a superconducting and voltage gap mode, said memory cells not using such superconducting junction devices, said circuit comprising:

a first superconducting junction device for selecting a memory array row;

a second superconducting device for selecting a memory array column;

a third and fourth superconducting device having a control loop for modifying the amount of critical current required switch modes;

a fourth superconducting device having a control loop for modifying the amount of critical required to switch modes;

first clock means connected to said first junction, said first clock means having a current signal that switches said first junction into the voltage gap mode thereby generating a memory array row select signal;

means for providing the row select signal to said third junction device control loop only when the memory cell contains a logic one;

means for providing the output voltage of said third junction device as an input control signal to said control loop of said fourth junction device;

second clock means connected to said second junction, said second clock means having a current signal that switches said second junction into the voltage gap mode thereby generating a memory array column select signal;

means for providing the column select signal to said third junction device, wherein the column select signal switches said third junction into the voltage gap mode when the respective control loop of said third junction is connected to the row select signal; and third clock means connected to said fourth junction, said third clock means having a current signal that switches said fourth junction into the voltage gap mode when the critical current of said fourth junction is reduced below said third clock means signal current by the fourth junction control loop resulting from the column select signal, causing the data contents of the memory cell to be presented at said fourth junction mode.

14. The circuit of claims 1 or 13 wherein the memory cells are one-bit binary semiconducting devices.

15. The circuit of claim 14 wherein the memory cells contain MOS transistors.

16. The circuit of claim 14 wherein the memory cells do not contain Josephson junctions.

17. The circuit of claim 14 wherein the read and write operations for the memory cells require voltage swings of from 2 to 5 volts.

18. The circuit of claim 14 wherein memory cells have static configuration.

19. The circuit of claim 14 wherein the memory cells have dynamic configuration.

20. The circuit of claim 14, further comprising the memory cell.

21. The circuit of claim 14 wherein the means for providing the column select signal to the third junction device includes a MOS transistor.

22. The circuit of claim 14 wherein a voltage swing of from 2 to 5 volts is applied to the control loop of the third superconducting device in order to modify the amount of critical current required to switch modes in the third superconducting device.

23. The circuit of claim 14 wherein the means for providing the output voltage of the third junction device as an input control signal includes a MOS transistor.

24. The circuit of claim 23 wherein a voltage swing of from 2 to 5 volts is applied by the MOS transistor as the input control signal.

* * * * *